(12) United States Patent
Sugiura

(10) Patent No.: US 9,385,711 B2
(45) Date of Patent: Jul. 5, 2016

(54) SWITCH DEVICE

(71) Applicant: Kojima Industries Corporation, Toyota-shi, Aichi (JP)

(72) Inventor: Seishi Sugiura, Toyota (JP)

(73) Assignee: Kojima Industries Corporation, Toyota-shi, Aichi (JP)

( * ) Notice: Subject to any disclaimer, the term of this patent is extended or adjusted under 35 U.S.C. 154(b) by 51 days.

(21) Appl. No.: 14/445,886

(22) Filed: Jul. 29, 2014

(65) Prior Publication Data

US 2015/0041292 A1  Feb. 12, 2015

(30) Foreign Application Priority Data

Aug. 8, 2013  (JP) ................... 2013-165196

(51) Int. Cl.
*H01H 9/18* (2006.01)
*H03K 17/96* (2006.01)
*H01H 13/14* (2006.01)
*H01H 3/02* (2006.01)

(52) U.S. Cl.
CPC ........... *H03K 17/9618* (2013.01); *H01H 13/14* (2013.01); *H03K 17/9622* (2013.01); *H01H 2003/0293* (2013.01); *H01H 2219/028* (2013.01); *H01H 2221/05* (2013.01); *H01H 2221/078* (2013.01); *H03K 2217/960705* (2013.01); *H03K 2217/960755* (2013.01)

(58) Field of Classification Search
CPC ................................. H01H 9/18; H01H 13/64

USPC .......................................... 200/5 A, 17 R, 600
See application file for complete search history.

(56) References Cited

U.S. PATENT DOCUMENTS

2012/0256838 A1* 10/2012 Lee .................... H03K 17/9643
345/168

FOREIGN PATENT DOCUMENTS

| JP | 2003-177871 A | 6/2003 | |
| JP | 2007-317393 A | 12/2007 | |
| JP | 2012-134030 A | 7/2012 | |
| JP | 2012-134030 | * 12/2012 | ............. H01H 13/64 |

* cited by examiner

*Primary Examiner* — Edwin A. Leon
*Assistant Examiner* — Iman Malakooti
(74) *Attorney, Agent, or Firm* — Eric D. Babych; Brinks Gilson & Lione

(57) ABSTRACT

A switch device includes a housing, a substrate, a single operation knob including an operation plate having operation indications provided thereon and moving in a direction toward and away from the substrate, a push switch fixed to the substrate, a plurality of touch electrodes to mounted on the substrate for sensing proximity of a finger and outputting a proximity signal, and a control circuit configured to output a command signal to an electrical circuit based on proximity signals from the respective touch electrodes when a press signal is input thereto. The sensing portions of the touch electrodes are disposed so as to form a space between the sensing portions and the operation plate when the operation knob is not depressed by a finger, and to come close to the operation plate when the operation knob is depressed by a finger.

2 Claims, 4 Drawing Sheets

SWITCH DEVICE

CROSS-REFERENCE TO RELATED APPLICATIONS

This application claims priority to Japanese Patent Application No. 2013-165196, filed on Aug. 8, 2013, which is incorporated herein by reference in its entirety.

BACKGROUND

1. Technical Field

The present invention relates to a switch device for use in controlling a plurality of electrical circuits.

2. Background Art

JP 2012-134030 A and JP 2003-177871 A describe, as a switch device for use in control of a plurality of electrical circuits, a switch device including a touch sensor which an operator can touch with their finger for inputting information, as an input unit.

In the switch device described above, as input is accepted even if the operator touches the touch sensor by mistake, there is a possibility that a control operation which is not desired by the operator will be performed for the electrical circuits.

JP 2007-317393 A discloses a switch device capable of inhibiting control of the electrical circuits which is against the operator's intention, caused by the operator's erroneous touching of the touch sensor. This reference describes a switch device including an operation plate on which a plurality of operation indications are described, a plurality of touch electrodes configured to output a proximity signal representing the operation indication touched by the operator, a press switch which is depressed to output a press signal, and a control section configured to output a command signal to an electrical circuit. The touch electrodes are provided integrally with the operation plate and corresponding to the respective operation indications. The press switch is depressed by the operator pressing the operation plate. The control section identifies the input of a proximity signal only upon the input of the press signal and outputs a command signal to the electrical circuit based on the identified proximity signal.

In the switch device described in JP 2007-317393 A, in which the touch electrodes are integrally formed with the operation plate, the touch electrodes move with the operation plate when the operator presses the operation plate. However, in order to allow the simultaneous movement of the operation plate and the touch electrodes, the touch electrodes cannot be fixed to the circuit board. Accordingly, in the switch device described in JP 2007-317393 A, it is necessary to connect between the circuit board and the touch electrodes with a flexible harness or a flexible substrate, which results in an increase in the number of components and an increase in costs.

Further, as a force required for pressing the touch electrodes varies depending on the handling state of the harness or the flexible substrate, such a force may vary for each switch device due to the manufacturing accuracy at the time of mass production.

Also, in order to prevent the harness or the flexible substrate being broken by pressing the touch electrodes repeatedly, high durability is required for each component. In addition, as the harness or the flexible substrate would be hardened due to a change over time, the sense of operation perceived by the operator when pressing the touch electrodes may change after using the switch device for a long time.

The advantage of the present invention is therefore to provide a switch device for use in controlling a plurality of electrical circuits, in which touch electrodes can be fixed to a circuit board without the use of a harness or a flexible substrate, and the number of components can be reduced.

BRIEF SUMMARY

In accordance with an aspect of the invention, a switch device for use in controlling a plurality of electrical circuits, includes a housing; a substrate fixed to a bottom portion of the housing; a single operation knob including an operation plate having a plurality of operation indications corresponding to a plurality of electrical circuits, respectively, being provided thereon, the operation indications being configured to be touched by a finger, and a wall portion extending from a peripheral edge of the operation plate toward the substrate and being guided by the housing, the operation knob being configured to move in a direction toward and away from the substrate by being pressed by a finger; a single push switch fixed to the substrate, the push switch being configured to be depressed by the operation knob to output a press signal when the operation knob is pressed by a finger; a plurality of touch electrodes mounted on the substrate within the housing so as to correspond to the plurality of operation indications of the operation knob, respectively, the touch electrodes being configured to sense proximity of a finger and output a proximity signal; and a control circuit configured to determine the operation indication being touched by a finger based on the proximity signal of each of the touch electrodes and output a command signal to an electrical circuit corresponding to the operation indication being touched by a finger, when a press signal is input thereto. Each of the touch electrodes includes a sensing portion for sensing proximity of a finger and a leg portion fixed to the substrate, and the leg portion holds the sensing portion spaced from the substrate such that when the operation knob is not depressed by a finger, a space is formed between a surface of the operation plate toward the substrate and the sensing portion and when the operation knob is depressed by a finger, the surface of the operation plate toward the substrate and the sensing portion come close to each other.

Preferably, in the switch device of the present invention, one of the plurality of operation indications is a no-operation indication, and the control circuit determines that the no-operation indication is touched by a finger when only the press signal is input thereto and the proximity signal is not input thereto.

According to the present invention, it is possible to achieve an advantage that in a switch device for use in controlling a plurality of electrical circuits, touch electrodes can be fixed to a circuit board without the use of a harness or a flexible substrate, and the number of components can be reduced.

BRIEF DESCRIPTION OF THE SEVERAL VIEWS OF THE DRAWINGS

A preferred embodiment of the present invention will be described in detail based on the following figures, wherein.

DETAILED DESCRIPTION

Figure 1:
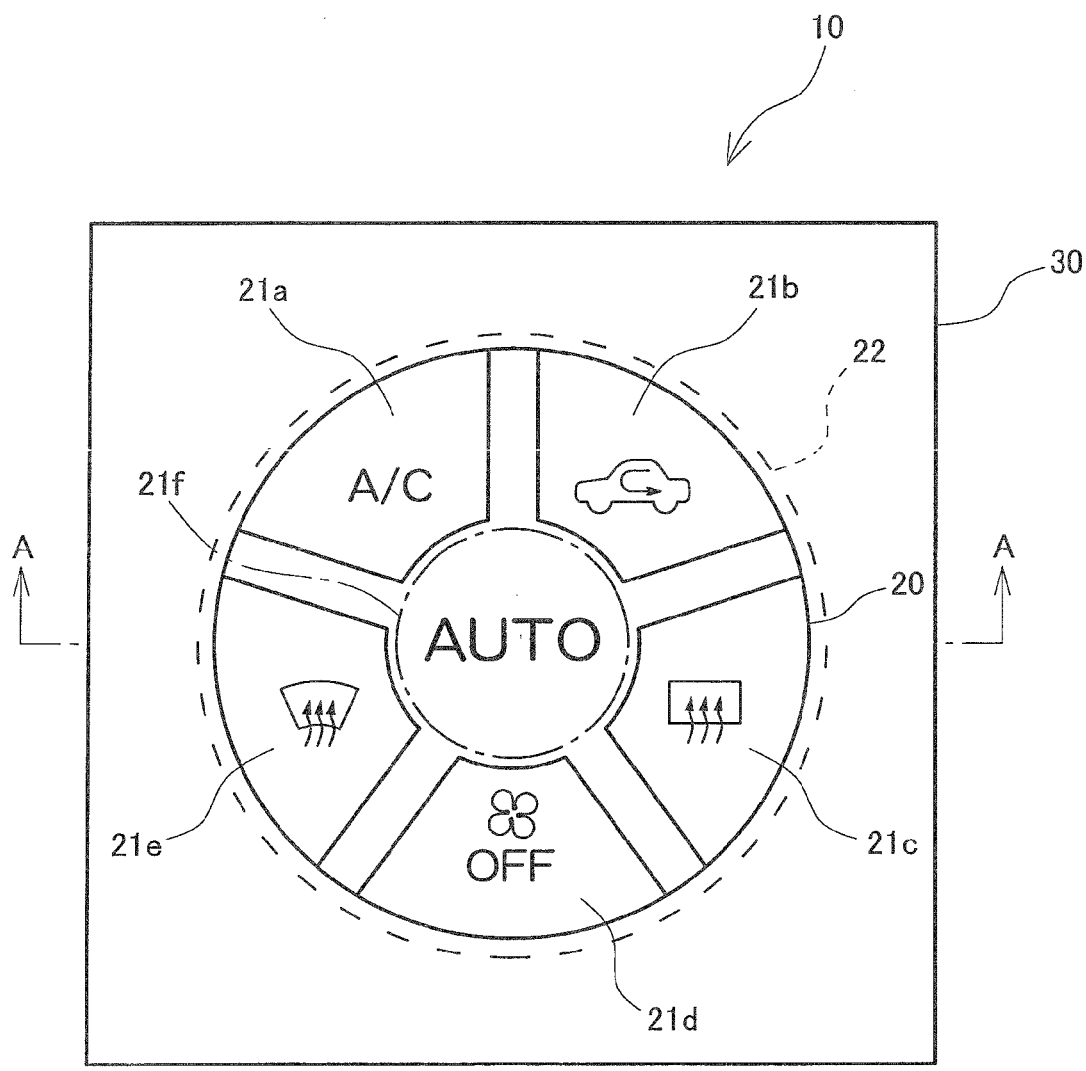
FIG. 1 is a view illustrating a switch device for use in controlling a plurality of electrical circuits according to an embodiment of the present invention.

A preferred embodiment of the present invention will be described in detail with reference to the accompanying drawings. FIG. 1 illustrates a switch device 10 for use in controlling an in-vehicle air conditioner, as a switch device for use in controlling a plurality of electrical circuits.

As illustrated in FIG. 1, the switch device 10 includes an operation knob 20 and a housing 30. As illustrated in FIG. 1, a plurality of operation indications 21a to 21f which an operator touches with their finger are arranged on the surface of the operation knob 20 so as to correspond to a plurality of electrical circuits, respectively. Specifically, the operation indications 21a to 21e are arranged on the surface of the operation knob 20 sequentially, starting from the upper left position, in the order of an operation indication 21a for air conditioner ON/OFF switching, an operation indication 21b for switching between intake of the outside air and circulation of the inside air, an operation indication 21c for a defogger heating wire on the rear widow, an operation indication 21d for stopping air blow, and an operation indication 21e for blowing air to prevent windshield fogging, along the outer circumference of the operation knob 20 in the clockwise direction. An operation indication 21f for selecting of the auto air conditioning operation mode is further provided in the center region on the surface of the operation knob 20.

As illustrated in FIG. 1, the operation knob 20 includes a collar portion 22 located along the outer circumference of the operation knob 20 within the housing 30. The collar portion 22 is provided in contact with the inner side of the housing 30 so as to prevent the operation knob 20 from coming out from the housing 30 toward the front side in FIG. 1.

Figure 2A:
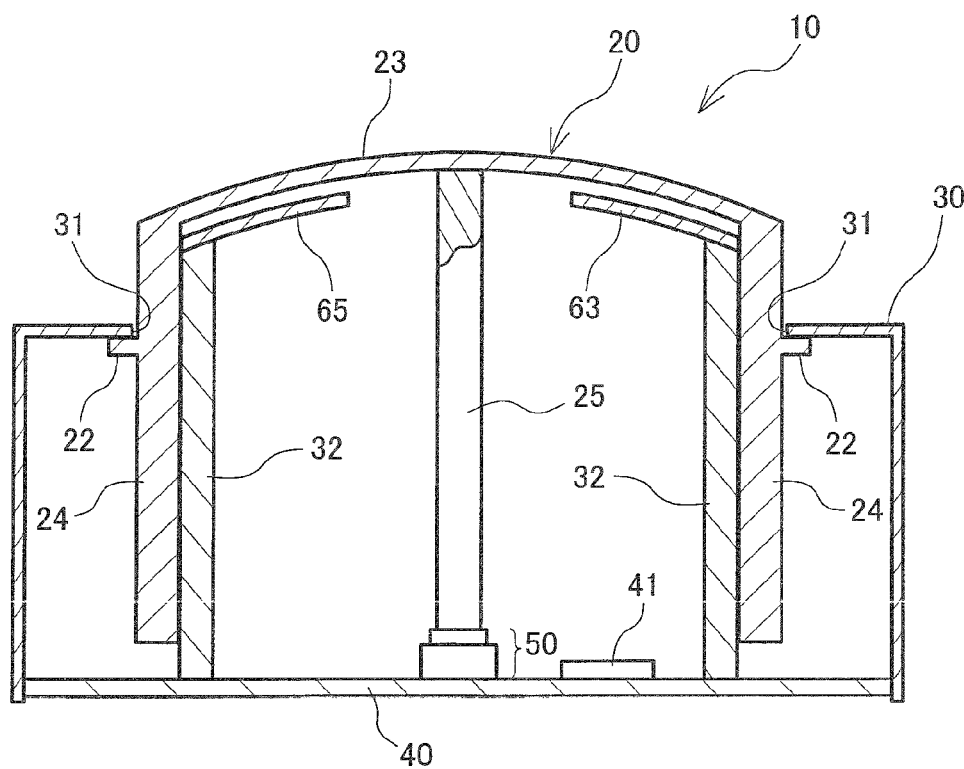
FIG. 2A is a cross sectional view of the switch device according to the embodiment of the present invention, taken along line A-A in FIG. 1, in which the operation knob is not depressed.
Figure 2B:
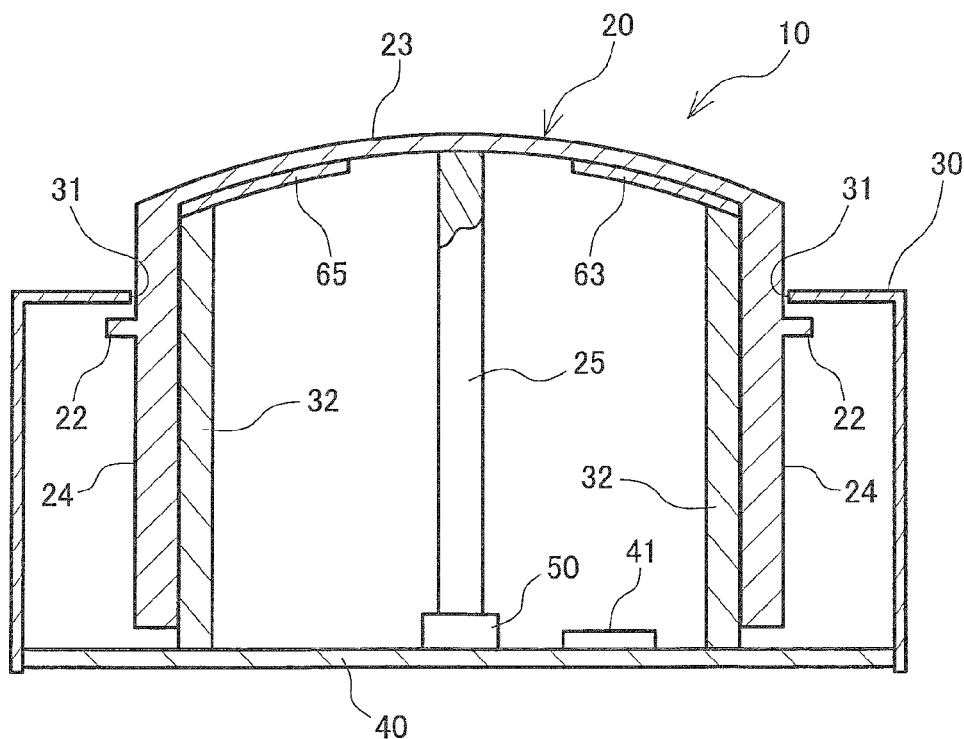
FIG. 2B is a cross sectional view of the switch device according to the embodiment of the present invention, taken along line A-A in FIG. 1, in which the operation knob is depressed.
Figure 3:
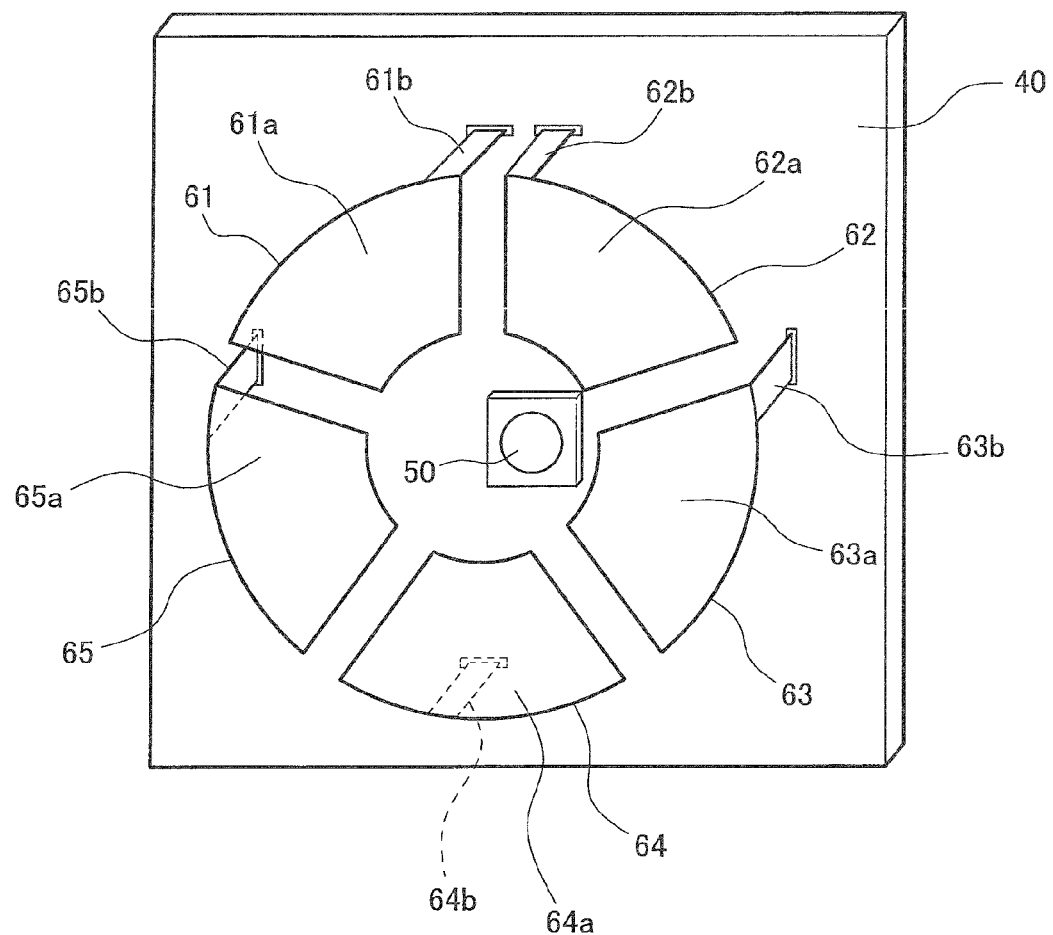
FIG. 3 is a perspective view illustrating a substrate, a push switch, and touch electrodes of the switch device according to the present embodiment.

FIGS. 2A and 2B are cross sectional views of the switch device 10 taken along line A-A in FIG. 1. FIG. 2A illustrates a state in which the operation knob 20 is not depressed by an operator's finger and FIG. 2B illustrates a state in which the operation knob 20 is depressed by an operator's finger. FIG. 3 illustrates a positional relationship among a substrate 40, a push switch 50, and a plurality of touch electrodes 61 to 65.

As illustrated in FIGS. 2A and 2B, the operation knob 20 includes an operation plate 23 having the operation indications 21a to 21f arranged on the surface thereof, a wall portion 24 extending downwardly from the end portion of the operation panel 23, and a pressing projection portion 25 extending downwardly from the center of the operation plate 23. The collar portion 22 is provided so as to project outwardly from the wall portion 24. As illustrated in FIG. 2A, the collar portion 22 is provided so as to come into contact with the housing 30 when the operation knob 20 is not pushed by the operator's finger. The operation knob 20 is provided so as to move with respect to the housing 30, and more specifically, so as to move in a direction toward and away from the substrate 40 which is fixed to the housing 30 (i.e. in a upward-downward direction), from the state illustrated in FIG. 2A to the state illustrated in FIG. 2B by being depressed by the operator's finger.

The housing 30 includes an opening portion 31 provided on the upper portion of the housing 30 and a retainer 32 which is disposed to project upward from the bottom portion of the housing 30. As illustrated in FIGS. 2A and 2B, the wall portion 24 is inserted between the opening portion 31 and the retainer 32. With such a structure, the wall portion 24 is guided by the retainer 32 disposed on the housing 30 when the operation knob 20 is depressed (when the operation knob 20 moves toward the substrate 40), so that the operation knob 20 can move without being slanted with respect to the housing 30 when any of the operation indications 21a to 21f is touched by the operator to press the operation knob 20.

The substrate 40 is fixed to the bottom portion of the housing 30, and the push switch 50 is fixed on the substrate 40. A control circuit 41 which is composed of a semiconductor element is disposed on the substrate 40. As illustrated in FIG. 2B, when the operation knob 20 is depressed by the operator's finger (when the operation knob 20 moves toward the substrate 40), the push switch 50 is pressed by the pressing projection portion 25 to output a press signal to the control circuit 41. When the pressing force to the operation knob 20 is released, the push switch 50 restores to the original state as illustrated in FIG. 2A to push the pressing projection portion 25 back (to move the operation knob 20 away from the substrate 40), thereby moving the operation knob 20 back to the original position before being depressed. As illustrated in FIG. 2A, by bringing the collar portion 22 into contact with the housing 30, the operation knob 20 is prevented from jumping out of the housing 30 when returning to the original position.

The plurality of touch electrodes are disposed within the housing 30. The arrangement of the touch electrodes will be described with reference to FIG. 3.

As illustrated in FIG. 3, on the substrate 40, the plurality of touch electrodes 61 to 65 are provided so as to correspond to the plurality of operation indications on the operation plate 23, respectively. Specifically, the touch electrode 61 corresponding to the operation indication 21a for ON/OFF switching of the air conditioner, the touch electrode 62 corresponding to the operation indication 21b for switching between intake of outside air and circulation of inside air, the touch electrode 63 corresponding to the operation indication 21c for a defogger heating wire on the rear window, the touch electrode 64 corresponding to the operation indication 21d for stopping air blow, and the touch electrode 65 corresponding to the operation indication 21e for blowing air to prevent windshield fogging, are sequentially provided in this order in the clockwise direction starting from the touch electrode at the upper left position in FIG. 3. As no touch electrode is provided at a position corresponding to the operation indication 21f for selecting of the auto air conditioning operation mode, the operation indication 21f is rendered as a no-operation indication. The touch electrode senses a finger being in proximity and outputs a proximity signal to the control circuit 41. As the touch electrode, a touch electrode which can sense proximity of a finger by a capacitive method, for example, and which need not be touched directly by a finger is used. FIGS. 2A and 2B illustrate cross sections of two touch electrodes 63 and 65.

As illustrated in FIG. 2A, when the operation knob 20 is not depressed by the operator's finger, the top portions of the touch electrodes 63 and 65 are spaced from the operation plate 23 such that a space is formed between the top portions of the touch electrodes 63 and 65 and the surface of the operation plate 23 opposite the substrate 40 (i.e. rear surface). When the operation knob 20 is depressed by the operator's finger, the rear surface of the operation plate 23 and the top portions of the touch electrodes 63 and 65 come close to each other such that no space is formed between the rear surface of the operation plate 23 and the top portions of the touch electrodes 63 and 65, as illustrated in FIG. 2B. The positional relationships between other touch electrodes 61, 62, and 64 and the rear surface of the operation plate 23 are the same as those in the case of the touch electrodes 63 and 65.

As illustrated in FIG. 3, the touch electrodes 61 to 65 include sensing portions 61*a* to 65*a*, respectively, for sensing a finger being in proximity, and leg portions 61*b* to 65*b*, respectively, connected to the substrate 40, which are integrally formed by press forming of a metal plate. The touch electrodes 61 to 65 are mounted on the substrate 40 by press fitting or soldering the leg portions 61*b* to 65*b* onto the substrate 40. As described above, the leg portions 61*b* to 65*b* hold the respective sensing portions 61*a* to 65*a* spaced from the substrate 40 such that when the operation knob 20 is not depressed by an operator's finger, a space is formed between the surface of the operation plate 23 on the substrate 40 side and the sensing portions 61*a* to 65*a*, and when the operation knob 20 is depressed by an operator's finger, the surface of the operation plate 23 on the substrate 40 side and the sensing portions 61*a* to 65*a* come close to each other.

Figure 4:
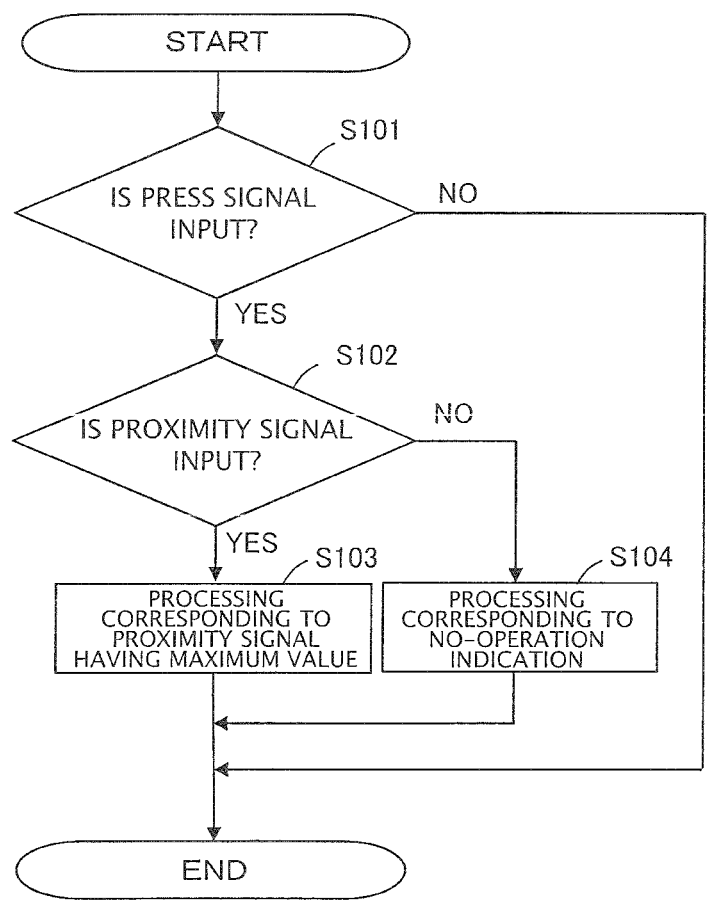
FIG. 4 is a flowchart showing processing of the control circuit of the switch device according to the embodiment of the present invention.

Control of the switch device 10 which is configured as described above will now be described. FIG. 4 is a flowchart indicating processing performed by the control circuit 41 of the switch device 10.

In step S101, the control circuit 41 determines whether or not a press signal is input from the push switch 50. If YES is determined in step S101, i.e. if a press signal is input to the control circuit 41, the control circuit 41 then confirms whether or not proximity signals from the touch electrodes 61 to 65 are present in step S102. In the present embodiment, each of the touch electrodes 61 to 65 outputs a proximity signal before the press signal is output.

If YES is determined in step S102, i.e. if the proximity signals are present, the control circuit 41, determining that the operation indication corresponding to the touch electrode which outputs a proximity signal representing the largest value among the proximity signals has been depressed by a finger, outputs a command signal to the electrical circuit corresponding to the operation indication.

If NO is determined in step S101, on the other hand, i.e. if a press signal is not input, the control circuit 41 does not read proximity signals output from the touch electrodes 61 to 65 or does not output a command signal to the electrical circuit.

If NO is determined in step S102, i.e. if none of the touch electrodes outputs a proximity signal, the control circuit 41, determining that the operator has pressed the no-operation indication having no corresponding touch electrode with their finger, outputs a command signal to the electrical circuit corresponding to the no-operation indication. In the present embodiment, the control circuit 41 determines that the operator presses the operation indication 21*f* for selecting of the auto air conditioning operation mode by their finger, and outputs a command signal to the electrical circuit corresponding to the operation indication 21*f*. Concerning the proximity signal, the greater the threshold value of the proximity signal, the larger the region of no-operation indication, and the smaller the threshold value of the proximity signal, the smaller the region of no-operation indication. Thus, the threshold of the proximity signal can be determined as appropriate in consideration of the operability.

As described above, with the switch device 10 according to the present embodiment, as, when pressing the operation knob 20, the touch electrodes 61 to 65 are not depressed by the operation plate 23, it is possible to provide the touch electrodes 61 to 65 within the housing 30 in a fixed manner.

As, in the switch device 10 according to the present embodiment, it is possible to provide the touch electrodes 61 to 65 in a fixed manner, it is not necessary to connect the substrate 40 and the touch electrodes 61 to 65 by using a flexible harness or a flexible substrate, so that the number of components can be reduced.

Further, as, in the switch device 10 according to the present embodiment, it is not necessary to connect the substrate 40 and the touch electrodes 61 to 65 by using a flexible harness or a flexible substrate, a variation of the force necessary for the operation or a change in the sense of operation caused by the harness or the like can be prevented.

With the switch device 10 according to the present embodiment, when the operation knob 20 is depressed, the operation plate 23 comes close to the touch electrodes 61 to 65 such that no space is formed between the rear surface of the operation plate 23 and the top portions of the touch electrodes 61 to 65. Accordingly, the positional relationship between the operation plate 23 and the touch electrodes 61 to 65 in the switch device 10 according to the present embodiment is similar to that in a switch device in which the touch electrodes are integrally provided on the operation plate. Further, as a proximity signal obtained when the operation knob 20 is depressed is used, with the switch device 10 according to the present embodiment, it is possible to use a touch electrode having a sense of touch which is approximately the same as that of the touch electrode used in a switch device in which the touch electrode is integrally provided in the operation plate.

As, in the switch device 10 according to the present embodiment, one of the plurality of operation indications 21*a* to 21*f* is a no-operation indication having no corresponding touch electrode, it is not necessary to provide touch electrodes for all the operation indications, which results in a reduction in the number of components.

As, in the switch device 10 according to the present embodiment, an input is determined by pressing down the operation knob 20 rather than merely touching the operation indications 21*a* to 21*f*, it is possible to prevent an erroneous input with which an input is erroneously determined when the operator only touches the operation indication.

While in the embodiment described above one of the plurality of operation indications is a no-operation indication having no corresponding touch electrode, the touch electrodes may be provided so as to correspond to all the operation indications, rather than providing a no-operation indication. In the above embodiment, when the operation knob is depressed by an object other than a finger, as no proximity signal is output from the touch electrode, it is determined that the no-operation indication has been selected although the operator actually selects the operation indication having a corresponding touch electrode. By providing the touch electrodes so as to correspond to all the operation indications, when no proximity signal is output from any of the touch electrodes, it is possible to determine that the operation knob has been pushed against the operator's intention rather than the operation knob having been pushed by a finger, and then determine that no input operation has been performed.

While, in the embodiment described above, when the operation knob is depressed, the operation plate and the touch electrodes come close to each other such that no space is formed between the rear surface of the operation plate and the top portions of the touch electrodes, the switch device may be configured such that a space having a certain size is formed between the rear surface of the operation plate and the upper portions of the touch electrode so long as the touch electrodes can sense the proximity of the operator's finger, even when the operation knob is depressed. With this configuration, it is possible to absorb variations in the assembling accuracy of the switch device. The space between the rear surface of the operation plate and the top portions of the touch electrodes can be set as desired within a range in which the touch electrodes can sense the proximity of the operator's finger.

While, in the embodiment described above, the proximity signal is output prior to the output of the press signal, the proximity signal may be output only when the press signal is output. With this configuration, it is possible to reduce the time when the proximity signal is output by the touch electrodes, so that power saving of the switch device can be achieved.

While, in the embodiment described above, a push-type operation knob is used, the push-type operation knob may be used in combination with a dial operation knob, or a seesaw switch or hinge switch may be also used. Any type of operation knob may be used so long as the operation knob is formed by a combination of a press switch and a touch electrode.

While, in the embodiment described above, the switch device is used for controlling an air conditioner of a vehicle, the switch device may be applied for any use so long as the switch device is used for controlling a plurality of electrical circuits.

While the preferred embodiment of the present invention has been described using specific terms, such description is for illustrative purposes only, and it is to be understood that changes and variations may be made without departing from the spirit or scope of the appended claims.

What is claimed is:

1. A switch device for use in controlling a plurality of electrical circuits, the switch device comprising:
   a housing;
   a substrate fixed to a bottom portion of the housing;
   a single operation knob including an operation plate having a plurality of operation indications corresponding to a plurality of electrical circuits, respectively, being provided thereon, the operation indications being configured to be touched by a finger, and a wall portion extending from a peripheral edge of the operation plate toward the substrate and being guided by the housing, the operation knob being configured to move in a direction toward and away from the substrate by being pressed by a finger;
   a single push switch fixed to the substrate, the push switch being configured to be depressed by the operation knob to output a press signal when the operation knob is pressed by a finger;
   a plurality of touch electrodes mounted on the substrate within the housing so as to correspond to the plurality of operation indications of the operation knob, respectively, the touch electrodes being configured to sense proximity of a finger and output a proximity signal; and
   a control circuit configured to determine the operation indication being touched by a finger based on the proximity signal of each of the touch electrodes and output a command signal to an electrical circuit corresponding to the operation indication being touched by a finger, when a press signal is input thereto,
   wherein
   each of the touch electrodes includes a sensing portion for sensing proximity of a finger and a leg portion fixed to the substrate,
   the leg portion holding the sensing portion spaced from the substrate such that when the operation knob is not depressed by a finger, a space is formed between a surface of the operation plate toward the substrate and the sensing portion, and when the operation knob is depressed by a finger, the surface of the operation plate toward the substrate and the sensing portion come close to each other.

2. The switch device according to claim 1, wherein
   one of the plurality of operation indications is a no-operation indication, and
   the control circuit determines that the no-operation indication is touched by a finger when only the press signal is input thereto and the proximity signal is not input thereto.

* * * * *